(12) United States Patent
Mouli

(10) Patent No.: US 7,265,328 B2
(45) Date of Patent: Sep. 4, 2007

(54) METHOD AND APPARATUS PROVIDING AN OPTICAL GUIDE FOR AN IMAGER PIXEL HAVING A RING OF AIR-FILLED SPACED SLOTS AROUND A PHOTOSENSOR

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 11/207,804

(22) Filed: Aug. 22, 2005

(65) Prior Publication Data

US 2007/0040102 A1 Feb. 22, 2007

(51) Int. Cl.
*H01L 27/00* (2006.01)
*H01L 31/00* (2006.01)
(52) U.S. Cl. .................. 250/208.1; 257/294; 257/435; 438/65
(58) Field of Classification Search ............. 250/208.1; 257/294, 432, 435; 438/65
See application file for complete search history.

(56) References Cited

U.S. PATENT DOCUMENTS

| | | | |
|---|---|---|---|
| 6,140,630 A | 10/2000 | Rhodes | |
| 6,177,333 B1 | 1/2001 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 * | 4/2002 | Rhodes | 257/215 |
| 6,995,442 B2 * | 2/2006 | Jiang et al. | 257/432 |
| 7,001,795 B2 * | 2/2006 | Jiang et al. | 438/64 |
| 7,078,779 B2 * | 7/2006 | Wang et al. | 257/432 |
| 2005/0045928 A1 * | 3/2005 | Kuriyama | 257/294 |
| 2005/0056901 A1 * | 3/2005 | Kuriyama | 257/428 |
| 2005/0236553 A1 * | 10/2005 | Noto et al. | 250/208.1 |
| 2005/0263676 A1 * | 12/2005 | Jeon | 250/208.1 |
| 2007/0040102 A1 * | 2/2007 | Mouli | 250/214.1 |
| 2007/0045511 A1 * | 3/2007 | Lee et al. | 250/208.1 |
| 2007/0045513 A1 * | 3/2007 | Lee et al. | 250/208.1 |

OTHER PUBLICATIONS

Mendis, et al., "CMOS Active Pixel Image Sensor", IEEE Transactions on Electron Devices, vol. 41, No. 3, Mar. 1994, pp. 452-453.
Nixon et al., "256×256 CMOS Active Pixel Sensor Camera-on-a-Chip", IEEE Journal of Solid-State Circuits, vol. 31, No. 12, Dec. 1996, pp. 2046-2050.
T. H. Hsu et al., "Light Guide for Pixel Crosstalk Improvement in Deep Submicron CMOS Image Sensor", IEEE Electron Device Letters, vol. 25, No. 1, Jan. 2004, pp. 22-24.
Yaung et al., "Air-Gap Guard Ring for Pixel Sensitivity and Crosstalk Improvement in Deep Sub-micron CMOS Image Sensor", IEEE, 2003.

* cited by examiner

*Primary Examiner*—John R. Lee
(74) *Attorney, Agent, or Firm*—Dickstein Shapiro LLP

(57) ABSTRACT

A device and method to provide an optical guide of a pixel to guide incoming light onto a photosensor of the pixel and to improve the optical crosstalk immunity of an image sensor. The optical guide consists of an optically reflecting barrier formed as a trench that mitigates against optical crosstalk. The optical guide is made of an air-filled ring of spaced slots. In another embodiment, the optical guide structure can be filled with a low dielectric material with an index of refraction that is less than the index of refraction of the material used for the surrounding layers.

55 Claims, 8 Drawing Sheets

METHOD AND APPARATUS PROVIDING AN OPTICAL GUIDE FOR AN IMAGER PIXEL HAVING A RING OF AIR-FILLED SPACED SLOTS AROUND A PHOTOSENSOR

The invention relates generally to solid state imaging devices and more particularly to a method and apparatus which optically isolates pixel regions to reduce optical crosstalk in a solid state image sensor.

BACKGROUND OF THE INVENTION

There are a number of different types of semiconductor-based imagers, including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and other image acquisition and processing systems.

CMOS imagers are well known. CMOS images are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Image Sensors," IEEE Transactions on Electron Devices, Vol. 41(3), pp. 452-453 (1994); and are also disclosed in U.S. Pat. Nos. 6,140,630, 6,204,524, 6,310,366, 6,326,652, 6,333,205, and 6,376,868; assigned to Micron Technology, Inc., the entire disclosures of which are incorporated herein by reference.

These imaging devices include an array of pixel cells, which converts light energy received, through an optical lens, into electrical signals. Each pixel cell contains a photosensor for converting a respective portion of a received image into an electrical signal. The electrical signals produced by the array of photosensors are processed to render a digital image.

The amount of charge generated by the photosensor corresponds to the intensity of light impinging on the photosensor. Accordingly, it is important that all of the light directed to the photosensor impinges on the photosensor rather than being reflected or refracted toward another photosensor as optical crosstalk.

For example, optical crosstalk may exist between neighboring photosensors in a pixel array. In an ideal imager, a light enters only through the surface of the photosensor that directly receives the light stimulus. In reality, however, some light intended for one photosensor also impinges on another photosensor through the sides of the optical path existing between a lens and photosensor.

Optical crosstalk can bring about undesirable results in the images produced by the imaging device. The undesirable results can become more pronounced as the density of a pixel cell in imager arrays increases, and as pixel cell size correspondingly decreases. The shrinking pixel cell sizes make it increasingly difficult to properly focus incoming light on the photosensor of each pixel cell without accompanying optical crosstalk.

Optical crosstalk can cause a blurring or reduction in contrast in images produced by the imaging device. Optical crosstalk also degrades the spatial resolution, reduces overall sensitivity, causes color mixing, and leads to image noise after color correction. As noted above, image degradation can become more pronounced as pixel cell and device sizes are reduced. Furthermore, degradation caused by optical crosstalk is more conspicuous at longer wavelengths of light. Light having longer wavelengths penetrates more deeply into the silicon structure of a pixel cell, providing more opportunities for the light to be reflected or refracted away from its intended photosensor target.

One proposal to reduce optical crosstalk provides a continuous air-gap around the optical path to a photosensor. See Dun-Nian Yaung et al., *Air-Gap Guard Ring for Pixel Sensitivity and Crosstalk Improvement in Deep Sub-micron CMOS Image Sensor*, PROC. OF IEDM, 2003; see also T. H. Hsu et al., *Light Guide for Pixel Cross Talk Improvement in Deep Submicron CMOS Image Sensor*, IEEE ELECTRON DEVICE LETTERS, vol. 25, no. 1, 2004, at 22-24. FIG. 1 represents a cross sectional view of an imager showing two exemplary prior art techniques for dealing with optical crosstalk. The FIG. 1 imager has an air-gap guard ring 221 surrounding a photosensor optical path 223 existing between a micro-lens 240 and a photosensor 220. The air gap ring 221 is shown as being fabricated in the lower metallization layers M2 of an imager. The air gap provides a refraction index difference between the air gap ($n_2=1$) and the surrounding dielectric layers ($n_1=1.4$~$1.6$) and thus, the majority of incident light will be collected in the targeted pixel cell due to the total internal reflection in the air-gap/dielectric film interface. However, the presence of an air gap ring 221 is not ideally suited for solid state imagers. There are several reliability issues with the air gap such as its structural instability. Also, the color filter array (CFA) process, widely used in color imager fabrication, is known to have metallic and mobile ion contaminants that might easily diffuse through the air gaps and affect the devices and photosensor characteristics in the underlying pixel circuit.

Alternatively as also shown in FIG. 1, planar metal-shielding 225 provided in an upper metallization layer M4 has been used in an effort to reduce optical crosstalk, but these may degrade pixel sensitivity and/or are not suitable for use in zooming lens systems.

Another method of reducing optical crosstalk uses optical waveguides. Optical waveguides are structures used for spatially confining and directing light onto the intended target. For instance, optical waveguides can be used to reduce the detrimental affects associated with light shields such as light piping and light shadowing. Optical waveguides, however, are not widely used to focus light directly onto the photosensor in imaging devices. Moreover, currently employed optical waveguide structures, require additional processing steps, adding to the complexity and costs of imager fabrication.

Accordingly, there is a need and desire for an improved apparatus and method for reducing optical crosstalk in imaging devices. There is also a need to more effectively and accurately increase overall pixel sensitivity and provide improved optical crosstalk immunity without adding complexity to the manufacturing process and/or increasing fabrication costs.

BRIEF SUMMARY OF THE INVENTION

Exemplary embodiments of the invention provide an optical guide structure for a pixel which guides incoming light onto the photosensor of the pixel. The optical guide structure consists of an optically reflecting barrier that mitigates against optical crosstalk. The optical guide structure is formed of a ring of spaced slots filled with air that provides an index of refraction that is less than the index of refraction of the material used for the surrounding dielectric.

This difference in refractive index causes an internal reflection into an optical path existing between a lens and pixel. The spaced slots are configured to reflect light according to the wavelengths meant to be reflected and their widths, which are determined by the physical geometry distance of the respective wavelength of the light array.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
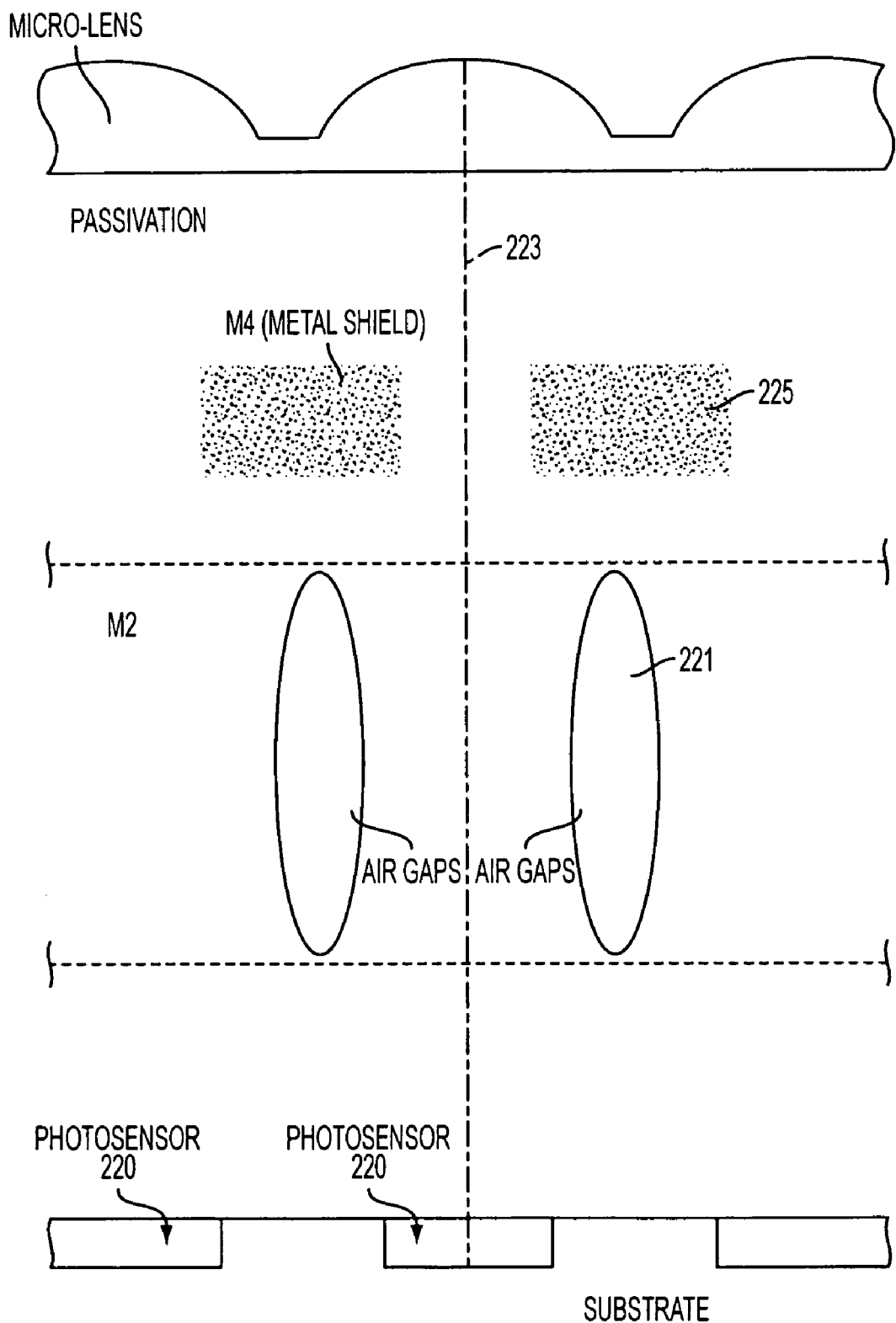
FIG. 1 illustrates a cross sectional view of a prior art pixel.

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made without departing from the spirit and scope of the present invention.

The terms "wafer" and "substrate" are to be understood as including all forms of semiconductor wafers and substrates including, silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or above the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photosensor and semiconductors for converting electromagnetic radiation to an electrical signal. For purposes of illustration, fabrication of a representative pixel is shown and described. Typically, fabrication of all pixels in an imager will proceed simultaneously in a similar fashion. The following detailed description is, therefore, not to be taken in a limiting sense, and the scope of the present invention is defined by the appended claims.

Although the invention is described herein with reference to the architecture and fabrication of one or a limited number of pixels, it should be understood that this is representative of a plurality of pixels as typically would be arranged in an imager array having pixel cells arranged, for example, in rows and columns.

In addition, although the invention is described below with reference to a pixel for a CMOS imager, the invention has applicability to all solid-state imaging devices using pixels (e.g., a CCD imager).

The invention may also be employed in display devices where a pixel has a light emitter for emitting light. The following detailed description is, therefore, not to be taken in a limiting sense, and the scope of the present invention is defined only by the appended claims.

Figure 2:
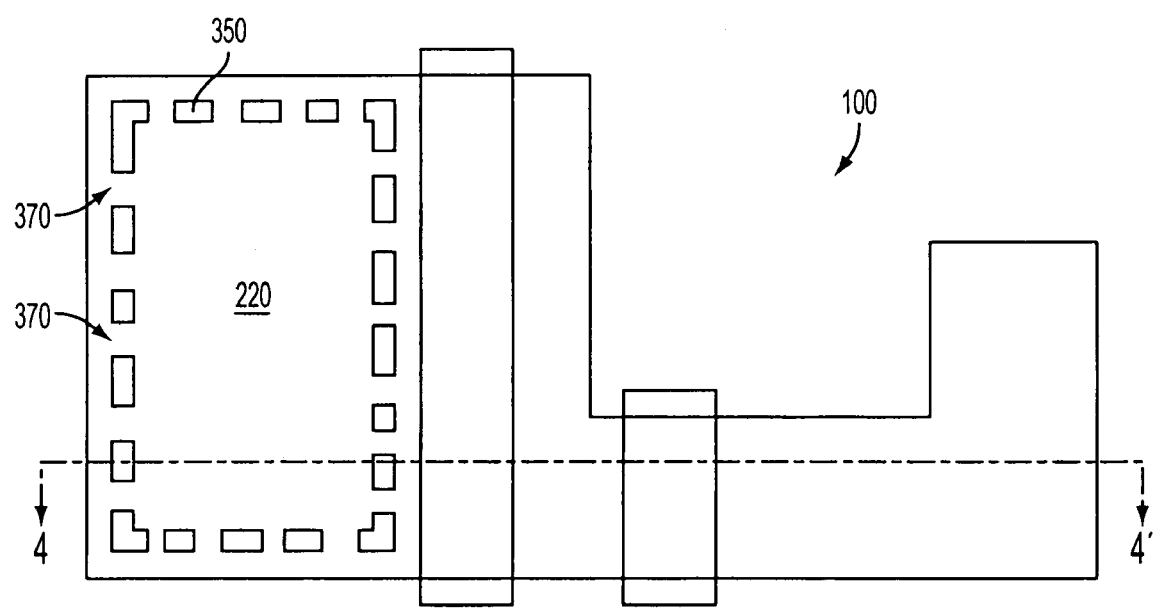
FIG. 2 is a plan view of a image sensor pixel constructed in accordance with an exemplary embodiment of the invention.
Figure 3:
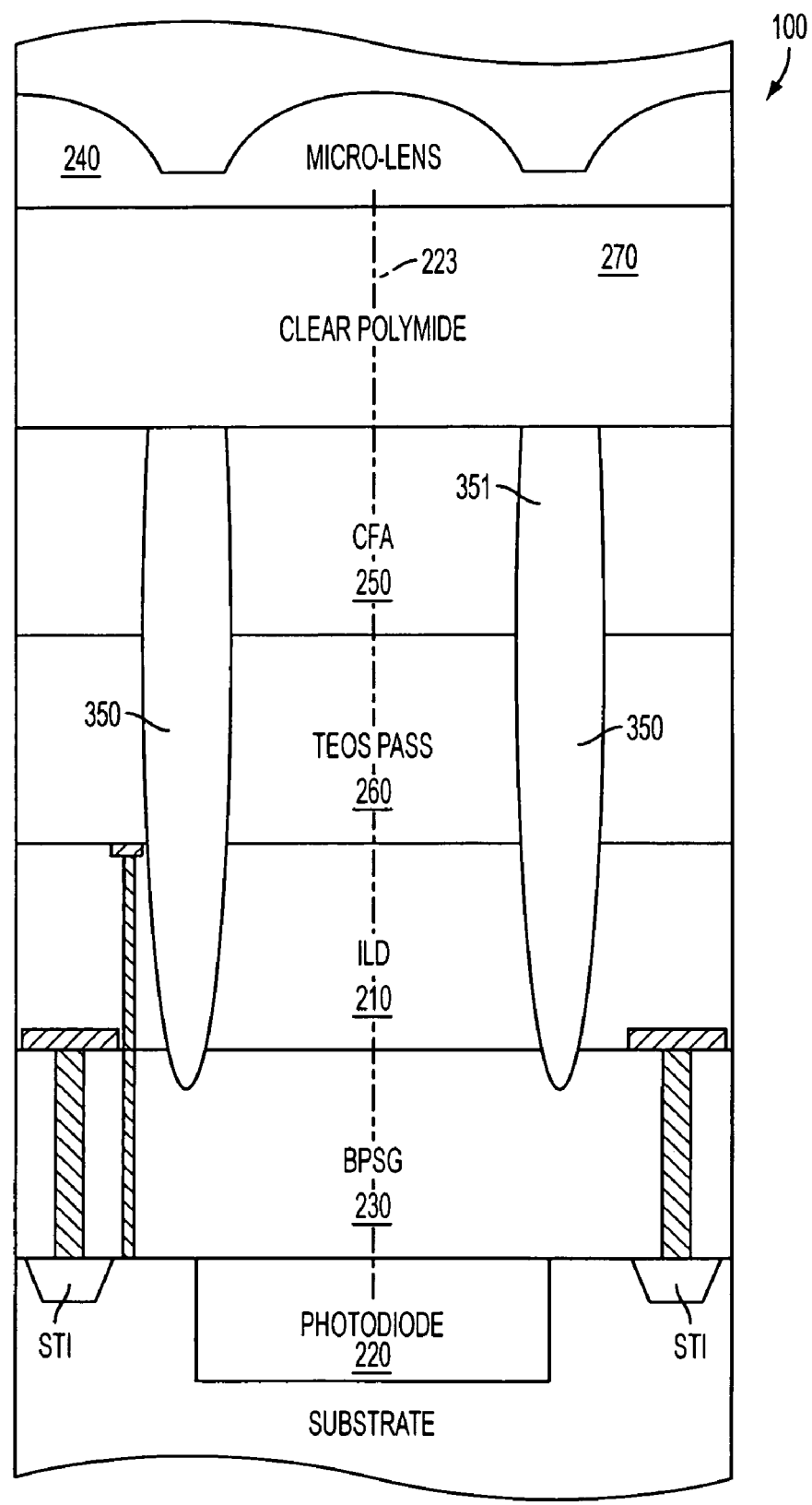
FIG. 3 shows a cross sectional view of the image sensor pixel of FIG. 2, constructed in accordance with the exemplary embodiment of the invention.

Referring to the FIG. 2 top down view and the FIG. 3 cross sectional view, embodiments of the invention provide a trench-like pattern 350 in an imager comprising a series of spaced trench-like etches surrounding the photosensor 220 filled with air 351, leaving non-trench regions 370 throughout the pattern. The spacing of the trenches is designed to provide internal reflection within the optical path 223. The trench pattern 350 is formed in optical path 223 between a photosensor layer 220 formed on a substrate and a micro lens layer 240 for each pixel cell. The trench pattern 350 surround the optical path between a lens and a corresponding photosensor of a pixel cell. The trench 350 is formed to surround a lateral area defined by the photosensor. The depth and width of the individual trenches in trench pattern 350 can be tailored depending on the need, and may extend from the upper layers of the image sensor, for example, beginning at the color filter array 250 level, to below a bottom ILD layer 210 into the protective layer 230, formed typically of BPSG, provided above the active area of the photosensor layer 220. The trench pattern can be etched by any method known in the art.

In a first embodiment of the invention, the trench pattern 350 is left hollow with air 351, forming air-gaps. The air gaps provide a refraction index difference between the air gap 351 ($n_2$=1) and the surrounding material layers 230, 210, 260, 250 ($n_1$=1.4~1.6). In other words, the air-gaps 351 within the trench pattern 350 have an index of refraction that is less than the index of refraction of the material used for the surrounding imager layers shows as the BPSG layer 230, ILD layers with associated metallization 210, passivation TEOS layer 260, and CFA layer 250.

The optical guide structure is designed to leave non-trench regions 370 within the trench pattern 350. The width of the non-trench regions 370 are configured to reflect light according to the wavelengths commonly known in the art. The width of the non-trench regions 370 are determined by the physical geometry distance of the respective wavelength of the light array that is meant to be reflected. For example, for a wavelength of 0.5 nm, the width of the non-trench regions 370 between trenched regions would be a distance of approximately 500 A. In essence, as long as the non-trench regions are smaller than the designated wavelength, the respective light wavelength will not be able to detect the non-trench regions 370. The optical guide structure, although containing non-trench regions, will function as a continuous trench-like pattern for optical purposes, while providing the optical guide structure with structural integrity due to the presence of the non-trenched areas in the trench pattern.

Figure 4:
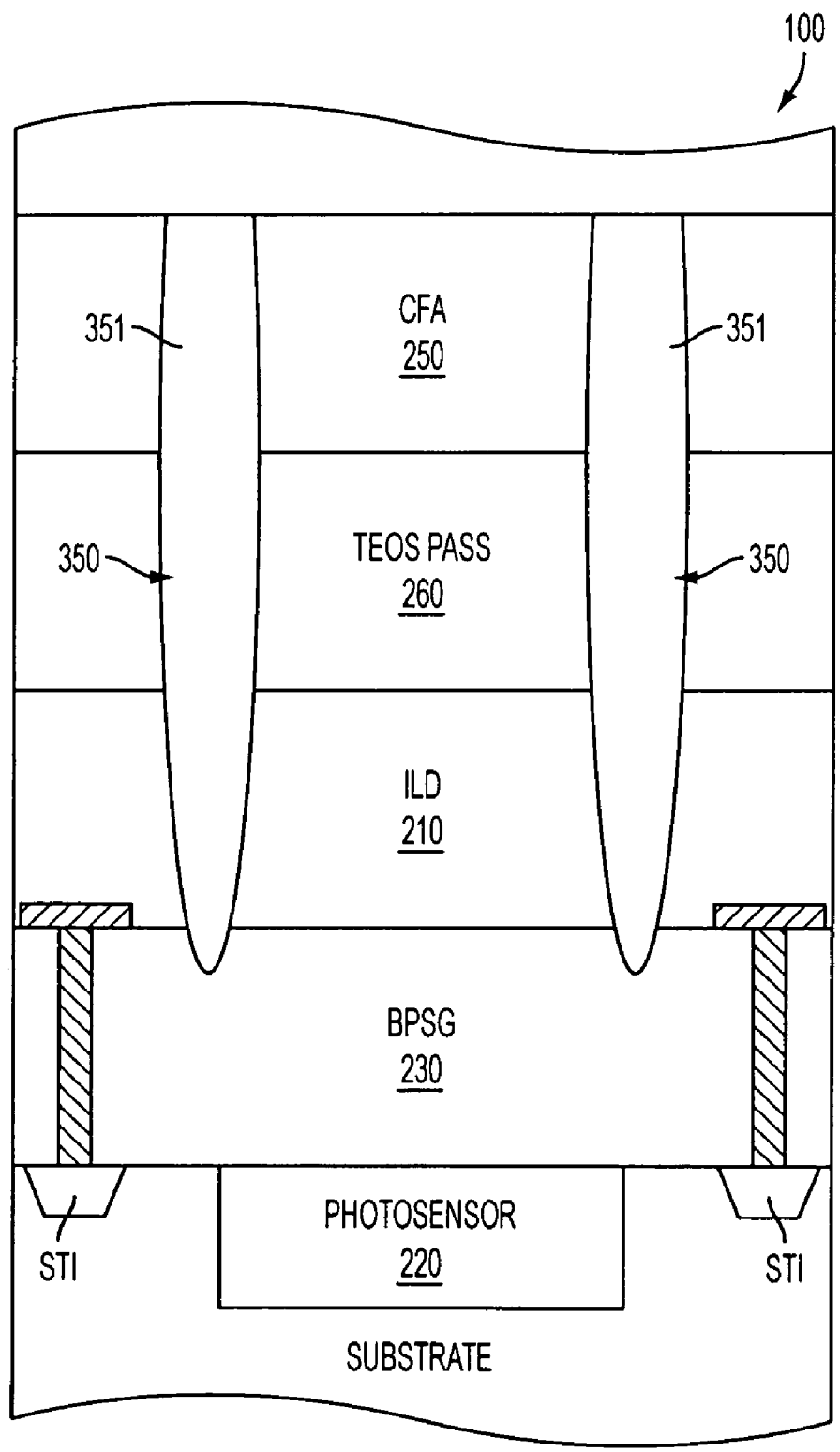
FIG. 4 shows the optical guide structure in accordance with the exemplary embodiment of the invention.

FIG. 4 illustrates the FIG. 3 structure prior to formation of an upper passivation layer 270 and micro-lens layer 240. The trench pattern 350 may be etched through the CFA layer 250, passivation layer 260, ILD and associated metallization layers 210 and partially into the BPSG layer 230. Then the passivation layer 270 and micro-lens layers are added.

Figure 5:
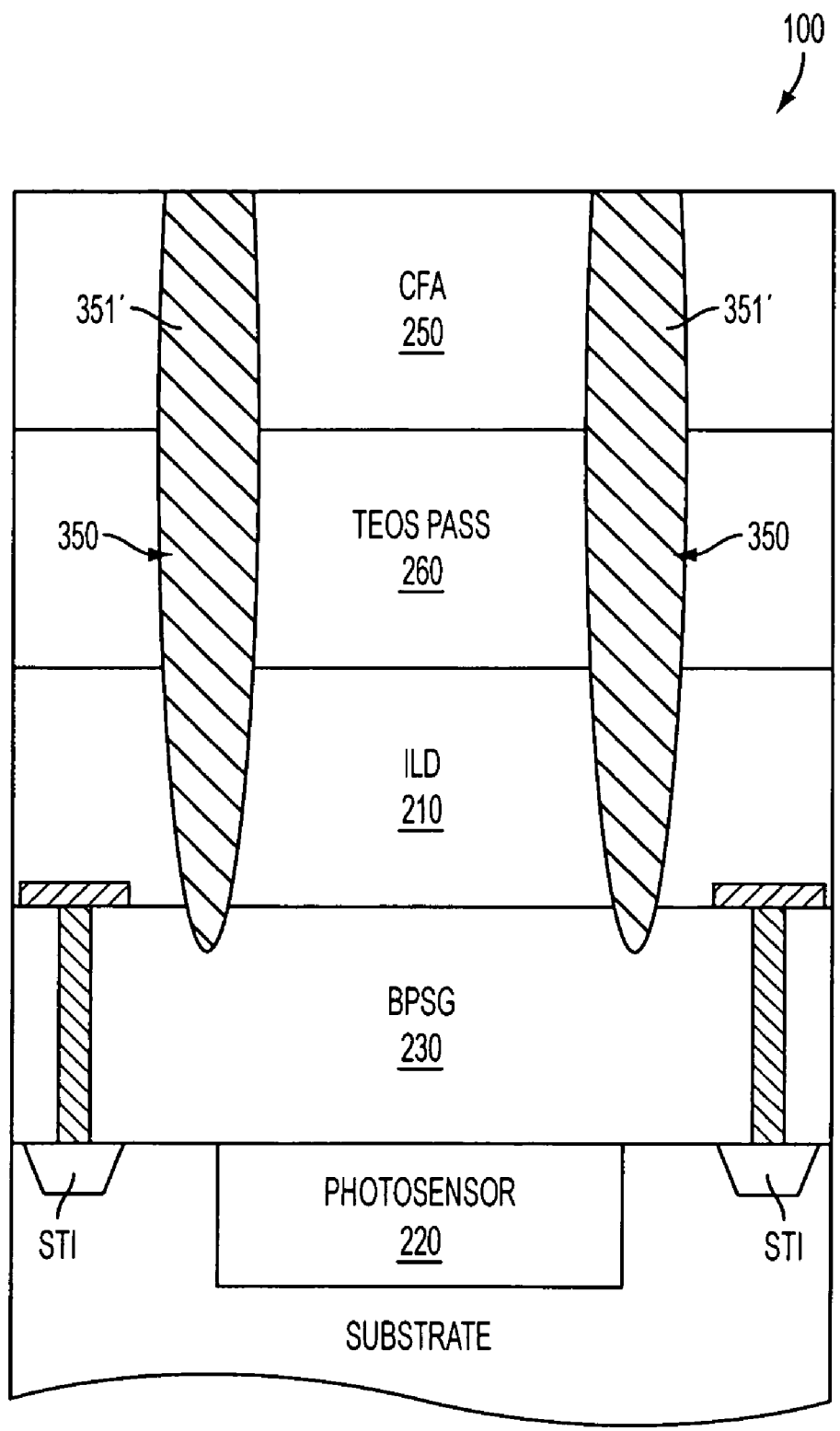
FIG. 5 shows the optical guide in accordance with another exemplary embodiment of the invention.

Referring to FIG. 5, in another embodiment, the trench-like pattern 350 can be filled with a low-dielectric constant material (low-k material), having a dielectric constant below 1.45. The low dielectric constant material 351' within trench pattern 350 has an index of refraction that is less than the index of refraction of the material used for the surrounding imager layers.

For example, the dielectric of the ILD layer 210 is typically implemented by depositing amorphous silicon dioxide, whose index of refraction is approximately between 1.45 and 1.54. Thus, in this example, a material with a lower index of refraction than 1.45 will fill the trench pattern 350. Additionally, there are numerous other low-k polymers (discussed below) that can be used for the fill material 351', as long as their respective reflective index is below that of the surrounding layers.

It should be appreciated that in the exemplary embodiment discussed above the trench-like pattern 350 has been described as extending to and through the ILD layer 210, passivation layer 260, and CFA layer 250, however it may be extended from or continue into additional layers. For example referring back to FIG. 3, trench pattern 350 may begin at the level of micro-lens layer 240, or at the level of passivation layer 270. In other words, the trench may extend through any other layer included within the image sensor between the photosensor layer 220 and the micro-lens layer 240. The invention may also be used in solid state imagers employing various kinds of photosensors formed on a substrate in photosensor layer 220, including but not limited to photodiodes, photoconductors, photogates, etc.

In all of the described embodiments, there is a difference in refractive index between the surrounding film material (refractive index=$n_1$) and the air 351 or the film material 351' used to fill the trench region 350 (refractive index=$n_2$). If $n_1$ is greater than $n_2$, for large angles of incidence of the light there would be total internal reflection, and a considerable reduction in optical crosstalk.

In general, low dielectric constant materials will provide low refractive indexes. The various exemplary embodiments may use various materials as the fill material 351' within the trench pattern 350 such as those that have predominantly oxide properties such as $SiO_2$/TEOS, Spin-cn-dielectric oxide (SOD), carbon doped silicon di-oxides, fluorinated silica glass oxide (FSG), etc. It should be appreciated that this list of materials is in no way exhaustive of possible materials that can be used for filling the trench pattern 350 of the optical guide structure, as the important point is that the index of refraction of the trench pattern 350 fill material is lower than that of the material layer surrounding the trench pattern 350 along the optical path 223.

Additionally, the typical material used for the various layers 210, 260, 250, 270 is silicon dioxide, which has a low index of refraction. To improve the difference in the index of refraction between the fill material 351' and the surrounding material, the surrounding layers, e.g., 210, 260, 250, 270 may be formed with materials having a relatively high index of refraction, thus expanding the number of possible materials having a lower index of refraction, which can be used for the trench pattern 350 fill material.

Figure 6:
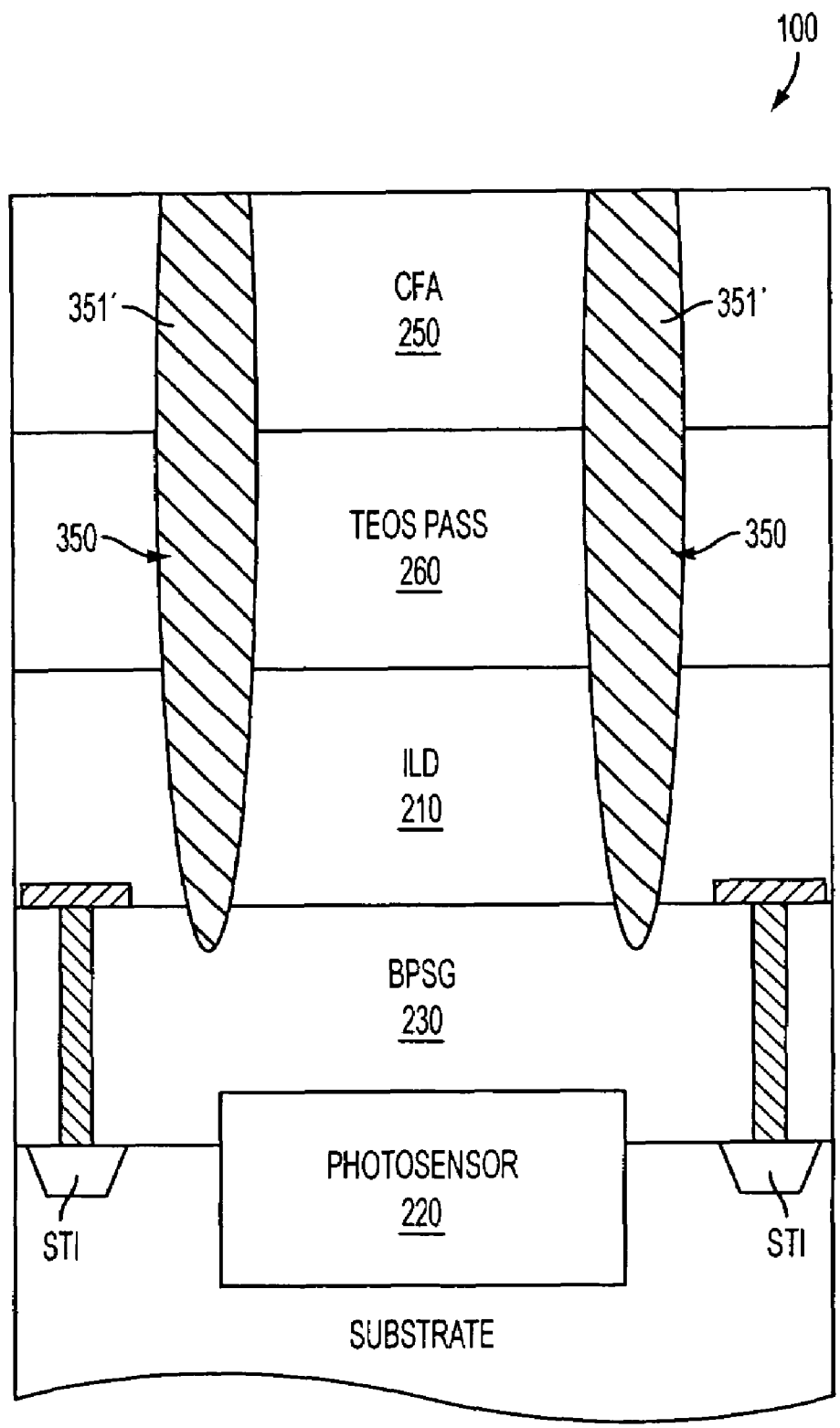
FIG. 6 shows the optical guide structure in accordance with another exemplary embodiment of the invention.

It should also be appreciated that in another exemplary embodiment the optical guide structure can be implemented above a raised photosensor structure, as described in U.S. patent application Ser. No. 10/857,876, filed on Jun. 2, 2004, entitled "Raised Photodiode Sensor"; assigned to Micron Technology, Inc., the entire disclosure of which is incorporated herein by reference. The optical guide 350 formed above a raised photosensor 220' will have the same effect of isolating the photosensor. As shown in FIG. 6, a cross-sectional view of the raised photosensor 220' within the image sensor, the optical guide structure 350 would be formed in the layers surrounding and above the raised photodiode, as described above.

Figure 7:
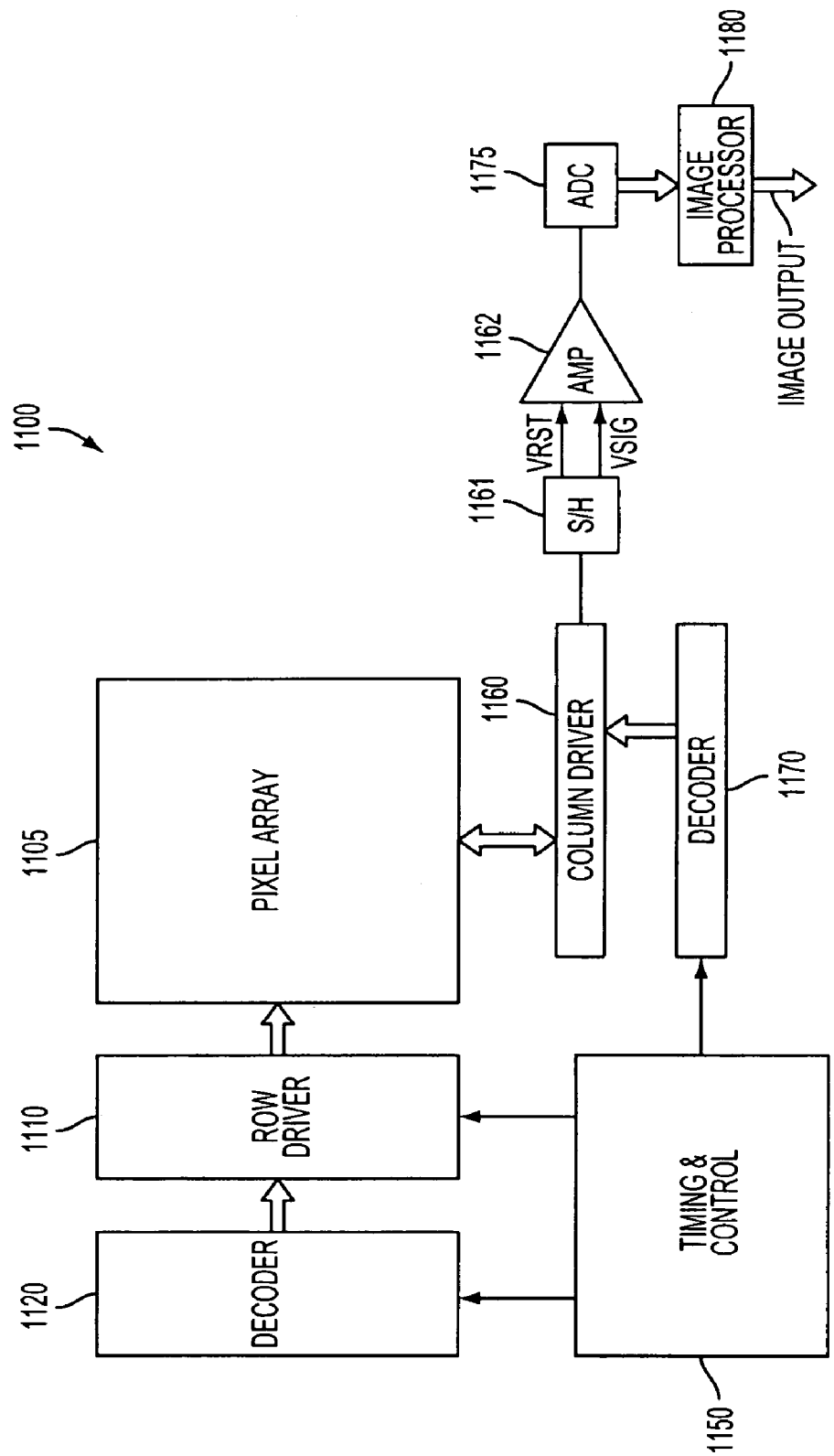
FIG. 7 shows a CMOS image sensor constructed in accordance with an embodiment of the invention.

FIG. 7 illustrates an exemplary imager 1100 that may utilize any embodiment of the invention. The Imager 1100 has a pixel array 1105 comprising pixels constructed with the optical guide structure (i.e., FIG. 3) in accordance with an embodiment of the invention, or using other pixel architectures including the same. Row lines are selectively activated by a row driver 1110 in response to row address decoder 1120. A column driver 1160 and column address decoder 1170 are also included in the imager 1100. The imager 1100 is operated by the timing and control circuit 1150, which controls the address decoders 1120, 1170.

A sample and hold circuit 1161 associated with the column driver 1160 reads a pixel reset signal Vrst and a pixel image signal Vsig for selected pixels. A differential signal (Vrst–Vsig) is amplified by differential amplifier 1162 for each pixel and is digitized by analog-to-digital converter 1175 (ADC). The analog-to-digital converter 1175 supplies the digitized pixel signals to an image processor 1180 which forms a digital image.

Figure 8:
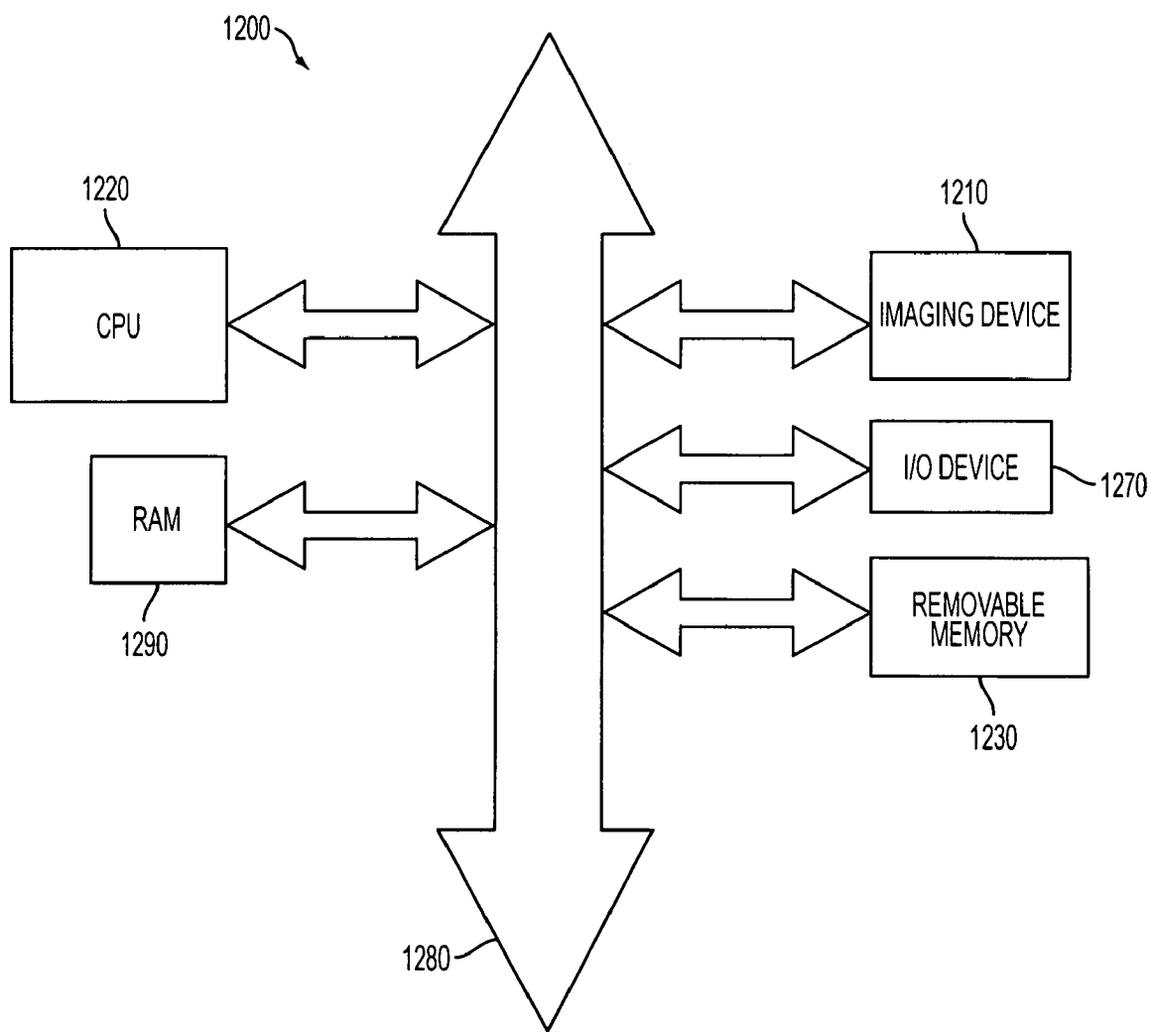
FIG. 8 shows a processor system incorporating at least one imager constructed in accordance with the exemplary embodiment of the invention.

FIG. 8 shows a system 1200, a typical processor system modified to include an imaging device 1210 (such as the imaging device 1100 illustrated in FIG. 7) of the invention. The processor system 1200 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 1200, for example a camera system, generally comprises a central processing unit (CPU) 1220, such as a microprocessor, that communicates with an input/output (I/O) device 1270 over a bus 1280. Imaging device 1210 also communicates with the CPU 1220 over the bus 1280. The processor-based system 1200 also includes random access memory (RAM) 1290, and can include removable memory 1230, such as flash memory, which also communicate with the CPU 1220 over the bus 1280. The imaging device 1210 may be combined with a processor, such as a CPU, digital signal processor, or microprocessor, with or without memory storage on a single integrated circuit or on a different chip than the processor.

It should be appreciated that there are likely many alternatives for materials that may be suitably employed to provide the optical guide for integrated image sensors including metals, polymers, semiconductors, and dielectric. This is especially true if a material other than amorphous silicon dioxide is used as the ILD. If the requirements of the optical guide cannot be met with a single material than a combination of materials can be used.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A pixel comprising:
   a photo-conversion device formed over a substrate;
   a lens over said photo-conversion device;
   a plurality of fabricated layers between said photo-conversion device and lens; and
   an optical guide structure formed in at least a portion of said plurality of fabricated layers, said optical guide structure comprising:
   a series of trenches formed within at least a portion of said plurality of fabricated layers to define said optical guide structure, wherein each of said series of trenches is separated from adjacent trenches by a non-trench region comprising of a material of said plurality of fabricated layers.

2. The pixel of claim 1, wherein said series of trenches are gas filled.

3. The pixel of claim 2, wherein said gas comprises air.

4. The pixel of claim 1, wherein said series of trenches comprise a second material filling each of said series of trenches.

5. The pixel of claim 4, wherein said second material has a low-dielectric constant less than 1.45.

6. The pixel of claim 4, wherein said second material is a low-dielectric constant material comprising carbon doped silicon dioxides.

7. The pixel of claim 4, wherein said second material is a low-dielectric constant material comprising fluorinated silica glass oxide.

8. The pixel of claim 1, wherein said series of trenches and said non-trench regions are formed above said photo-conversion device and are in a continuous pattern which surrounds a lateral area of said photo-conversion device.

9. The pixel of claim 1, wherein each of said non-trench regions have a physical geometry distance between trench regions that is smaller than a predetermined wavelength of light associated with said photo-conversion device.

10. The pixel of claim 1, wherein said series of trenches and said non-trench regions extend from a level below a level of said lens to a level above said substrate.

11. The pixel of claim 1, wherein said photo-conversion device is a photosensor.

12. The pixel of claim 1, wherein said photo-conversion device is a photo emitter.

13. The pixel of claim 1, wherein said photo-conversion device is formed at least partially above said substrate.

14. The pixel of claim 13, wherein said photo-conversion device above said substrate is an epitaxial layer.

15. A pixel comprising:
    a photo-conversion device formed over a substrate;
    a lens over said photo-conversion device;
    a plurality of fabricated layers between said photo-conversion device and lens; and
    an optical guide structure formed in at least a portion of said plurality of fabricated layers, said optical guide structure comprising:
    a series of trenches formed within at least a portion of said plurality of fabricated layers to define said optical guide structure, wherein each of said series of trenches is separated from adjacent trenches by a non-trench region comprising of a material of said plurality of fabricated layers;
    wherein said series of trenches are air gaps and each of said non-trench regions have a physical geometry distance between trench regions that is smaller than a predetermined wavelength of light associated with said photo-conversion device.

16. The pixel of claim 15, wherein said series of trenches and said non-trench regions extend from a level below a level of said lens to a level above said substrate.

17. The pixel of claim 15, wherein said photo-conversion device is a photosensor.

18. The pixel of claim 15, wherein said photo-conversion device is a photo emitter.

19. The pixel of claim 15, wherein said series of trenches and said non-trench regions are formed above said photo-conversion device and are in a continuous pattern which surrounds a lateral area of said photo-conversion device.

20. The pixel of claim 15, wherein said photo-conversion device is formed at least partially above said substrate.

21. The pixel of claim 20, wherein said photo-conversion device above said substrate is an epitaxial layer.

22. An image sensor comprising:
    at least one pixel comprising:
    a photo-conversion device;
    a lens for receiving incident light;
    a plurality of fabricated layers between said lens and photo-conversion device, said lens and photo-conversion device defining an optical path through said plurality of fabricated layers; and
    an optical guide structure comprising:
    a series of trenches formed within at least a portion of said plurality of fabricated layers to define said optical guide structure, wherein each of said series of trenches is separated from adjacent trenches by a non-trench region comprising of a material of said plurality of fabricated layers.

23. The image sensor of claim 22, wherein each of said series of trenches and said non-trench regions are formed above said photo-conversion device and are in a continuous pattern which surrounds a lateral area of said photo-conversion device.

24. The image sensor of claim 22, wherein said series of trenches are gas filled.

25. The image sensor of claim 22, wherein said gas comprises air.

26. The image sensor of claim 22, wherein said series of trenches comprise a second material filling each of said series of trenches.

27. The image sensor of claim 26, wherein said second material has a low-dielectric constant less than 1.45.

28. The image sensor of claim 22, wherein each of said non-trench regions have a physical geometry distance that is smaller than a predetermined wavelength of light associated with said photo-conversion device.

29. The image sensor of claim 22, wherein each of said series of trenches and said non-trench regions extend from a level below a level of said lens to a level above said substrate.

30. The image sensor of claim 22, wherein said photo-conversion device is a photosensor.

31. The image sensor of claim 22, wherein said photo-conversion device is a photo emitter.

32. The image sensor of claim 22, wherein said photo-conversion device is formed at least partially above said substrate.

33. The image sensor of claim 32, wherein said photo-conversion device above said substrate is an epitaxial layer.

34. A system comprising:
a processor coupled to a image sensor, said image sensor comprising:
a photo-conversion device;
a lens for receiving incident light;
a plurality of fabricated layers between said lens and photo-conversion device, said lens and photo-conversion device defining an optical path through said plurality of fabricated layers; and
an optical guide structure comprising:
a series of trenches formed within at least a portion of said plurality of fabricated layers to define said optical guide structure, wherein each of said series of trenches is separated from adjacent trenches by a non-trench region comprising of a material of said plurality of fabricated layers.

35. The system of claim 34, wherein said series of trenches are air gaps.

36. The system of claim 34, wherein said series of trenches and said non-trench regions are formed above said photo-conversion device and are in a continuous pattern which surrounds a lateral area of said photo-conversion device.

37. The system of claim 34, wherein said series of trenches are filled with a second material filling said series of trenches and said second material has a low-dielectric constant less than 1.45.

38. The system of claim 34, wherein each of said non-trench regions have a physical geometry distance that is smaller than a predetermined wavelength of light associated with said photo-conversion device.

39. The system of claim 34, wherein said photo-conversion device is formed at least partially above said substrate and said photo-conversion device above said substrate is an epitaxial layer.

40. A CMOS image sensor comprising:
an array of CMOS image pixel cells arranged in rows and columns formed over a substrate, each image pixel cell comprising:
a photosensitive region; and
a lens for receiving incident light;
a plurality of fabricated layers between said lens and photosensitive region device, said lens and photosensitive region device defining an optical path through said plurality of fabricated layers; and
an optical guide structure comprising:
a series of trenches formed within at least a portion of said plurality of fabricated layers to define said optical guide structure, wherein each of said series of trenches is separated from adjacent trenches by a non-trench region comprising of a material of said plurality of fabricated layers.

41. The CMOS image sensor of claim 40, wherein said series of trenches are air-gaps.

42. The CMOS image sensor of claim 40, wherein said series of trenches are filled with a second material filling said series of trenches, said second material has a low-dielectric constant less than 1.45.

43. The CMOS image sensor of claim 40, wherein said series of trenches and said non-trench regions are formed above said photosensitive region and are in a continuous pattern which surrounds a lateral area by said photosensitive region.

44. The CMOS image sensor of claim 40, wherein each of said non-trench regions have a physical geometry distance that is smaller than a predetermined wavelength of light associated with said photosensitive region.

45. The CMOS image sensor of claim 40, wherein said photo-conversion device is formed at least partially above said substrate and said photo-conversion device above said substrate is an epitaxial layer.

46. An imager system comprising:
a processor; and
an imaging device electrically coupled to the processor, the imaging device comprising a CMOS pixel array, at least one pixel of the array comprising:
a photosensor formed in substrate;
a lens for receiving incident light;
a plurality of fabricated layers between said lens and photosensor, said lens and photosensor defining an optical path through said plurality of fabricated layers; and
an optical guide structure comprising:
a series of trenches formed within at least a portion of said plurality of fabricated layers to define said optical guide structure, wherein each of said series of trenches is separated from adjacent trenches by a non-trench region comprising of a material of said plurality of fabricated layers.

47. A method of forming an optical guide structure within a pixel cell of an imaging device, comprising the steps of:
forming a photo-conversion device in a substrate;
forming a plurality of fabricated layers over said photo-conversion device; and
etching a series of trenches into said dielectric layer, leaving a series of non-trench regions in the formed plurality of fabricated layers.

48. The method of claim 47, wherein leaving each of said non-trench regions leaves a physical geometry distance that is smaller than a predetermined wavelength of light associated with said photo-conversion device.

49. The method of claim 47, wherein said etching step comprises etching the series of trenches to surround a lateral area by said photo-conversion device leaving non-trench regions between each pair of trenches.

50. The method of claim 47, wherein said etching step comprises etching the series of trenches from a level below a level of a lens formed above said plurality of fabricated layers, to a level above said substrate.

51. The method of claim 47, wherein said filling step further comprises filling said trench with a second material having a lower refractive index.

52. The method of claim 47, wherein said etching steps comprises etching said series of trenches and series of non-trench regions from a level below a level of a lens formed above said plurality of fabricated layers, to a level above said substrate.

53. The method of claim 47, further comprising the step of growing an eptitaxial layer in contact with the top surface of said substrate.

54. A method of forming an optical guide structure within a CMOS image pixel cell of an imaging device, comprising the steps of:
forming a photosensor in a substrate;
forming a plurality of fabricated layers over said photosensor; and
etching a series of trenches into said dielectric layer, leaving a series of non-trench regions in the formed plurality of fabricated layers, wherein each of said non-trench regions leaves a physical geometry distance that is smaller than a predetermined wavelength of light associated with said photosensor.

55. The method of claim 54, further comprising the step of growing an eptitaxial layer in contact with the top surface of said substrate.

* * * * *

UNITED STATES PATENT AND TRADEMARK OFFICE
CERTIFICATE OF CORRECTION

PATENT NO. : 7,265,328 B2 Page 1 of 1
APPLICATION NO. : 11/207804
DATED : September 4, 2007
INVENTOR(S) : Mouli It is certified that error appears in the above-identified patent and that said Letters Patent is hereby corrected as shown below:

In column 10, line 49 (Approx.), in Claim 53, delete "eptitaxial" and insert -- epitaxial --, therefor.

In column 10, line 64, in Claim 55, delete "eptitaxial" and insert -- epitaxial --, therefor.

Signed and Sealed this

Twenty-seventh Day of November, 2007

JON W. DUDAS
*Director of the United States Patent and Trademark Office*